(12) United States Patent
Hizu

(10) Patent No.: US 8,406,370 B2
(45) Date of Patent: Mar. 26, 2013

(54) COUNTER CIRCUIT AND SOLID-STATE IMAGING DEVICE

(75) Inventor: Kazuki Hizu, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 40 days.

(21) Appl. No.: 13/179,009

(22) Filed: Jul. 8, 2011

(65) Prior Publication Data

US 2012/0093277 A1    Apr. 19, 2012

(30) Foreign Application Priority Data

Oct. 15, 2010    (JP) ................................ 2010-232346

(51) Int. Cl.
*H03K 23/00*    (2006.01)
(52) U.S. Cl. ............... 377/37; 377/42; 377/44; 377/107
(58) Field of Classification Search .................... 377/37, 377/42, 44, 107
See application file for complete search history.

(56) References Cited

U.S. PATENT DOCUMENTS

| 5,481,582 | A * | 1/1996 | Ibenthal | 377/107 |
| 7,088,279 | B2 * | 8/2006 | Muramatsu et al. | 341/155 |
| 2009/0060118 | A1 * | 3/2009 | Koh | 377/42 |
| 2009/0084941 | A1 * | 4/2009 | Muramatsu et al. | 250/208.1 |
| 2012/0261555 | A1 * | 10/2012 | Koh | 250/208.1 |

FOREIGN PATENT DOCUMENTS

| JP | 10-28047 | 1/1998 |
| JP | 2008-283556 | 11/2008 |

* cited by examiner

*Primary Examiner* — Lincoln Donovan
*Assistant Examiner* — William Hernandez
(74) *Attorney, Agent, or Firm* — Oblon, Spivak, McClelland, Maier & Neustadt, L.L.P.

(57) ABSTRACT

According to one embodiment, S (S is an integer equal to or larger than two) number of sub counters each count S number of clocks of different frequencies, and a clock switching unit is provided for each sub counter and starts a counting operation of a sub counter of a next stage after finishing a counting operation in a sub counter of a local stage.

14 Claims, 13 Drawing Sheets

COUNTER CIRCUIT AND SOLID-STATE IMAGING DEVICE

CROSS-REFERENCE TO RELATED APPLICATIONS

This application is based upon and claims the benefit of priority from the prior Japanese Patent Application No. 2010-232346, filed on Oct. 15, 2010; the entire contents of which are incorporated herein by reference.

FIELD

Embodiments described herein relate generally to a counter circuit and a solid-state imaging device.

BACKGROUND

In solid-state imaging devices, for realizing both a high quality and a high speed, there is a method of outputting pixel signals read out from a pixel array unit for each column after digitalizing the pixel signals in parallel in a column AD converter.

DETAILED DESCRIPTION

In general, according to one embodiment, a counter circuit includes S (S is an integer equal to or larger than two) number of sub counters and clock switching units. The S number of the sub counters each count S number of clocks of different frequencies. The clock switching unit is provided for each sub counter and starts a counting operation of a sub counter of a next stage after finishing the counting operation in a sub counter of a local stage.

Exemplary embodiments of a counter circuit and a solid-state imaging device will be explained below in detail with reference to the accompanying drawings. The present invention is not limited to the following embodiments.

(First Embodiment)

Figure 1:
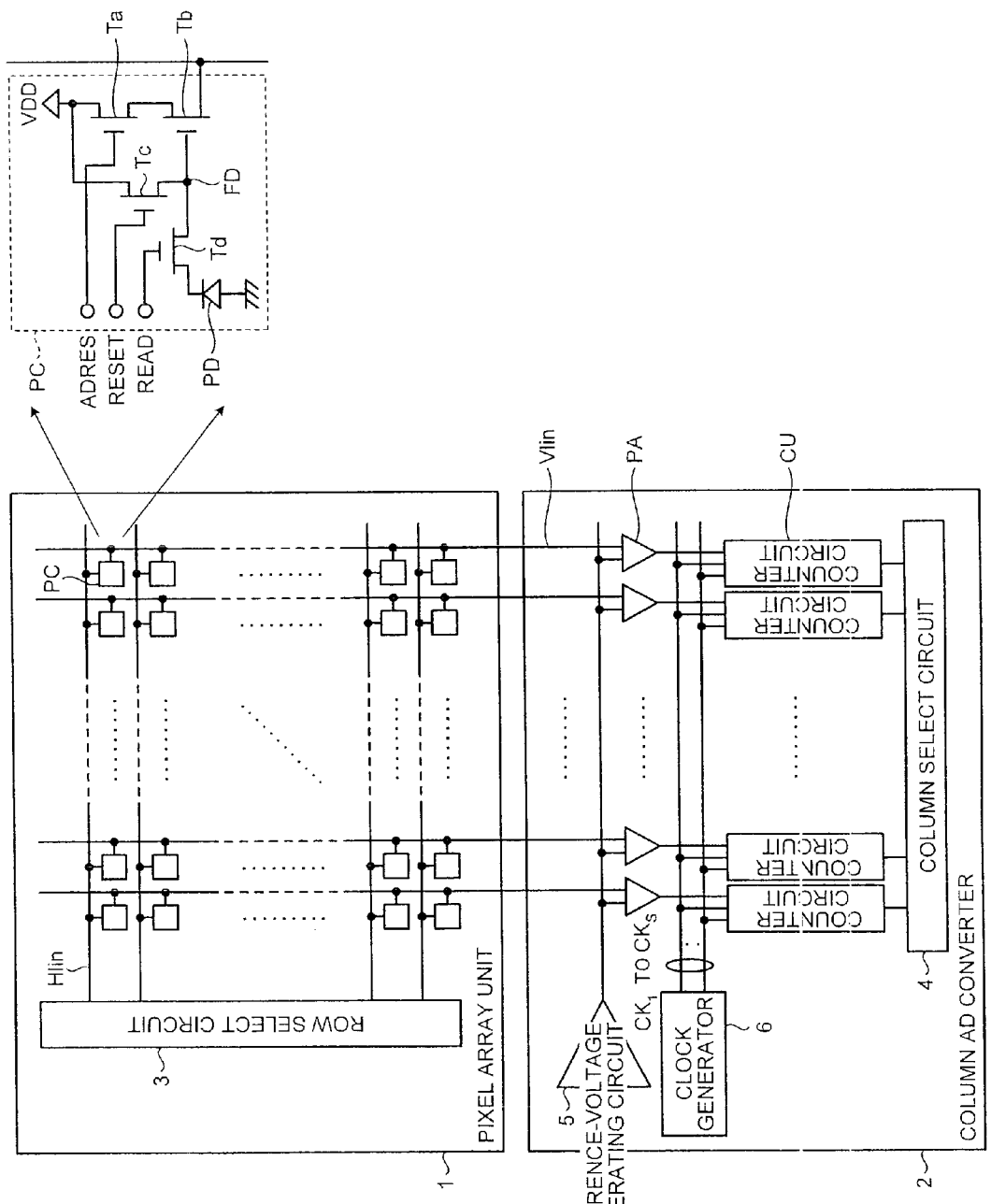
FIG. 1 is a block diagram illustrating a schematic configuration of a solid-state imaging device to which a counter circuit according to a first embodiment is applied.

FIG. 1 is a block diagram illustrating a schematic configuration of a solid-state imaging device to which a counter circuit according to the first embodiment is applied.

In FIG. 1, this solid-state imaging device includes a pixel array unit 1 in which pixels PC that accumulate therein photoelectrically-converted charges are arranged in a matrix manner in a row direction and a column direction. The pixel array unit 1 includes a row select circuit 3 that scans the pixels PC to be readout targets in a vertical direction.

The pixel PC includes a photodiode PD, a row select transistor Ta, an amplifying transistor Tb, a reset transistor Tc, and a readout transistor Td. A floating diffusion FD as a detection node is formed at the connection point of the amplifying transistor Tb, the reset transistor Tc, and the readout transistor Td.

The source of the readout transistor Td is connected to the photodiode PD and a readout signal READ is input to the gate of the readout transistor Td. Moreover, the source of the reset transistor Tc is connected to the drain of the readout transistor Td, a reset signal RESET is input to the gate of the reset transistor Tc, and the drain of the reset transistor Tc is connected to a power supply potential VDD. Furthermore, a row select signal ADRES is input to the gate of the row select transistor Ta, and the drain of the row select transistor Ta is connected to the power supply potential VDD. Moreover, the source of the amplifying transistor Tb is connected to a vertical signal line Vlin, the gate of the amplifying transistor Tb is connected to the drain of the readout transistor Td, and the drain of the amplifying transistor Tb is connected to the source of the row select transistor Ta.

In the pixel array unit 1, horizontal control lines Hlin that perform a readout control of the pixels PC are provided in the row direction and the vertical signal lines Vlin that transmit signals read out from the pixels PC are provided in the column direction. The horizontal control lines Hlin can transmit the readout signal READ, the reset signal RESET, and the row select signal ADRES to the pixels PC for each row.

Furthermore, in this solid-state imaging device, a column AD converter 2 is provided that converts a pixel signal transmitted via the vertical signal line Vlin into a digital value by converting the voltage of the pixel signal into time through comparison of the pixel signal with a reference voltage and counting the time in a counter circuit CU.

In the column AD converter 2, a column select circuit 4 that scans the pixels PC to be readout targets in a horizontal direction, a reference-voltage generating circuit 5 that generates a ramp reference voltage, a clock generator 6 that generates S (S is an integer equal to or larger than two) number of clocks $CK_1$ to $CK_S$ of different frequencies, comparators PA that compare the pixel signals transmitted via the vertical signal lines Vlin with the reference voltage, and the counter circuits CU each of which sequentially propagates start and stop of the counting operation by the S number of the clocks $CK_1$ to $CK_S$. The comparator PA and the counter circuit CU can be provided for each column.

When the pixels PC are scanned in the vertical direction by the row select circuit 3, the pixel PC in the row direction is selected and the signal read out from this pixel PC is transmitted to the column AD converter 2 via the vertical signal line Vlin.

Then, in the column AD converter 2, a reset level and a readout level are sampled from the signal of each pixel PC and the difference between the reset level and the readout level is taken to digitalize the signal component of each pixel PC in a CDS.

The S number of the clocks $CK_1$ to $CK_S$ are input from the clock generator 6 to the counter circuit CU. Then, the counter circuit CU performs the counting operation based on the comparison result by the comparator PA, whereby the signal component of each pixel PC is digitalized. At this time, in each counter circuit CU, start and stop of the counting operation by the S number of the clocks $CK_1$ to $CK_s$ are sequentially propagated. When the counting operation by the clock $CK_n$ (n is an integer satisfying $1 \leq n \leq S$) is performed, the counting operation by the clocks $CK_1$ to $CK_{n-1}$ and $CK_{n+1}$ to $CK_S$ is stopped.

Therefore, the frequency of the counting operation of higher order bits can be lowered, so that the power consumption can be reduced compared with the case of performing the counting operation by a clock having a single frequency.

Moreover, start and stop of the counting operation by the S number of the clocks $CK_1$ to $CK_S$ are sequentially propagated in each counter circuit CU, so that a signal indicating start and stop of the counting operation does not need to be input to each counter circuit CU from outside.

Figure 2:
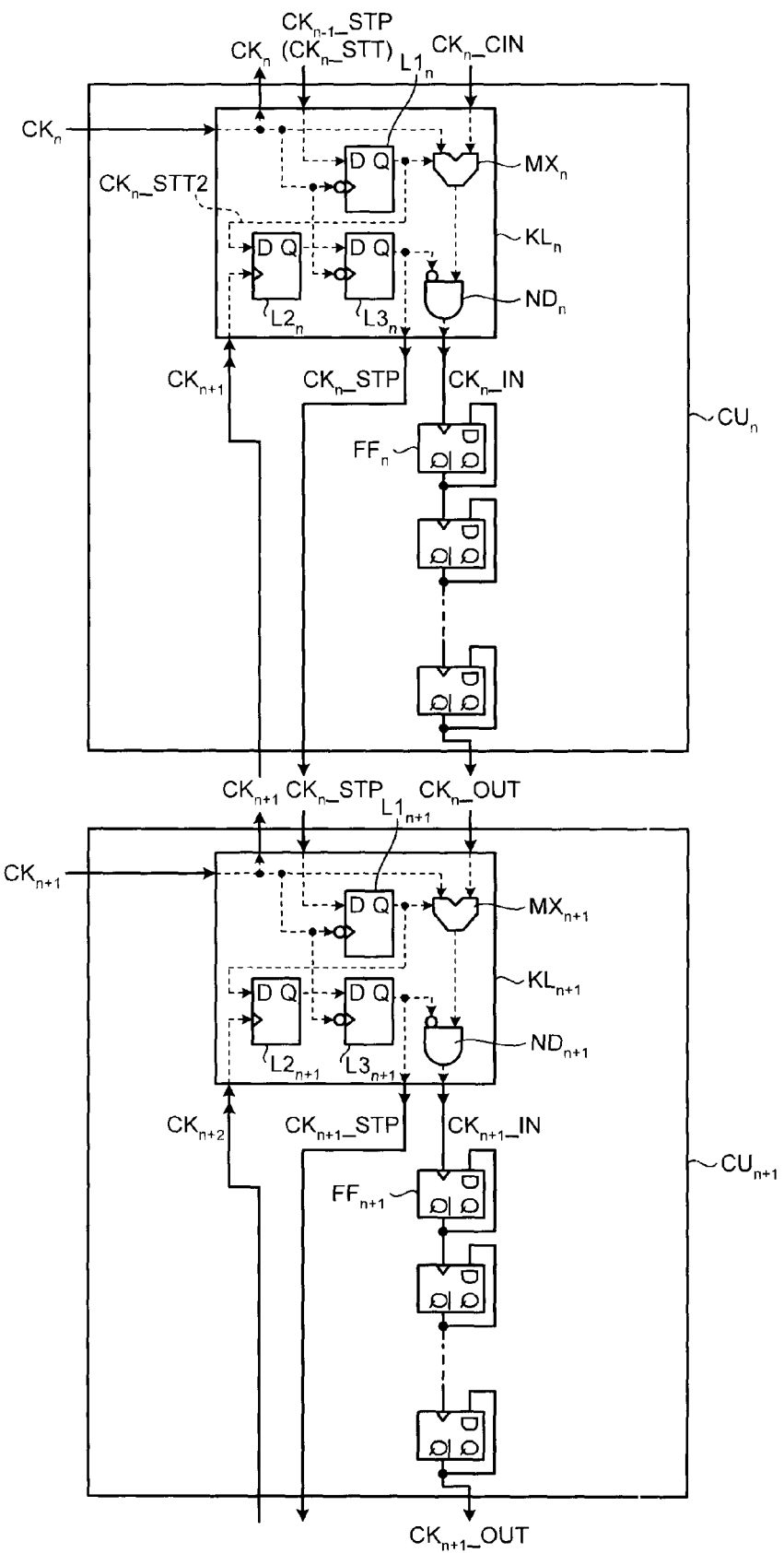
FIG. 2 is a block diagram illustrating a configuration of sub counters for two stages in the intermediate stage of the counter circuit according to the first embodiment.

FIG. 2 is a block diagram illustrating a configuration of sub counters for two stages in the intermediate stage of the counter circuit according to the first embodiment.

In FIG. 2, the counter circuit includes a sub counter $CU_n$ that performs the counting operation according to the clock $CK_n$ and a sub counter $CU_{n+1}$ that performs the counting operation according to the clock $CK_{n+1}$, and the sub counter $Cu_{n+1}$ is connected to the next stage of the sub counter $CU_n$. The frequency of the clock $CK_n$ of the sub counter $CU_n$ of the local stage can be set shorter than the frequency of the clock $CK_{n+1}$ of the sub counter $CU_{n+1}$ of the next stage.

The sub counters $CU_n$ and $CU_{n+1}$ include clock switching units $KL_n$ and $KL_{n+1}$ and flip-flops $FF_n$ and $FF_{n+1}$, respectively. The number of stages of the flip-flop $FF_n$ can be set to $\log_2 [f(CK_n)/f(CK_{n+1})]$, in which $f(CK_n)$ is the frequency of the clock $CK_n$ and $f(CK_{n+1})$ is the frequency of clock $CK_{n+1}$.

The clock switching units $KL_n$ and $KL_{n+1}$ can start the counting operation of the sub counters $CU_{n+1}$ and $CU_{n+2}$ of the next stage after finishing the counting operation in the sub counters $CU_n$ and $CU_{n+1}$ of the local stage, respectively. Moreover, the clock switching units $KL_n$ and $KL_{n+1}$ can transmit a carry signal to the sub counters $CU_{n+1}$ and $CU_{n+2}$ of the next stage before starting the counting operation of the sub counters $CU_{n+1}$ and $CU_{n+2}$ of the next stage, respectively.

The clock switching units $KL_n$ and $KL_{n+1}$ include selectors $MX_n$ and $MX_{n+1}$, AND circuits $ND_n$ and $ND_{n+1}$, and latch circuits $L1_n$, $L2_n$, and $L3_n$, and $L1_{n+1}$, $L2_{n+1}$, and $L3_{n+1}$, respectively.

The clock $CK_n$ is input to one input terminal of the selector $MX_n$, a carry signal $CK_n\_CIN$ is input to the other input terminal of the selector $MX_n$, and the output of the latch circuit $M_n$ is input to the switching terminal of the selector $MX_n$.

A count stop signal $CK_{n-1}\_STP$ of the previous stage is input to the input terminal of the latch circuit $L1_n$ as a count start signal $CK_n\_STT$ of the local stage and the inverted signal of the clock $CK_n$ is input to the clock terminal of the latch circuit $L1_n$.

The output of the latch circuit $L1_n$ is input to the input terminal of the latch circuit $L2_n$ and the clock $CK_{n+1}$ is input to the clock terminal of the latch circuit $L2_n$ via the sub counter $CU_{n+1}$ of the next stage.

The output of the latch circuit $L2_n$ is input to the input terminal of the latch circuit $L3_n$ and the inverted signal of the clock $CK_n$ is input to the clock terminal of the latch circuit $L3_n$.

The inverted signal of the output of the latch circuit $L3_n$ is input to one input terminal of the AND circuit $ND_n$ and the output of the selector $MX_n$ is input to the other input terminal of the AND circuit $ND_n$. The output of the AND circuit $ND_n$ is input to the latch circuit $L1_{n+1}$ as a count stop signal $CK_n\_STP$.

An output $CK_n\_IN$ of the AND circuit $ND_n$ is input to the first stage of the flip-flop $FF_n$, the inverted output of each flip-flop $FF_n$ is input to the clock terminal of the flip-flop $FF_n$ of the local stage, and the inverted output of the last stage of the flip-flop $FF_n$ is input to the selector $MX_{n+1}$ as a carry signal $CK_n\_OUT$.

Figure 3:
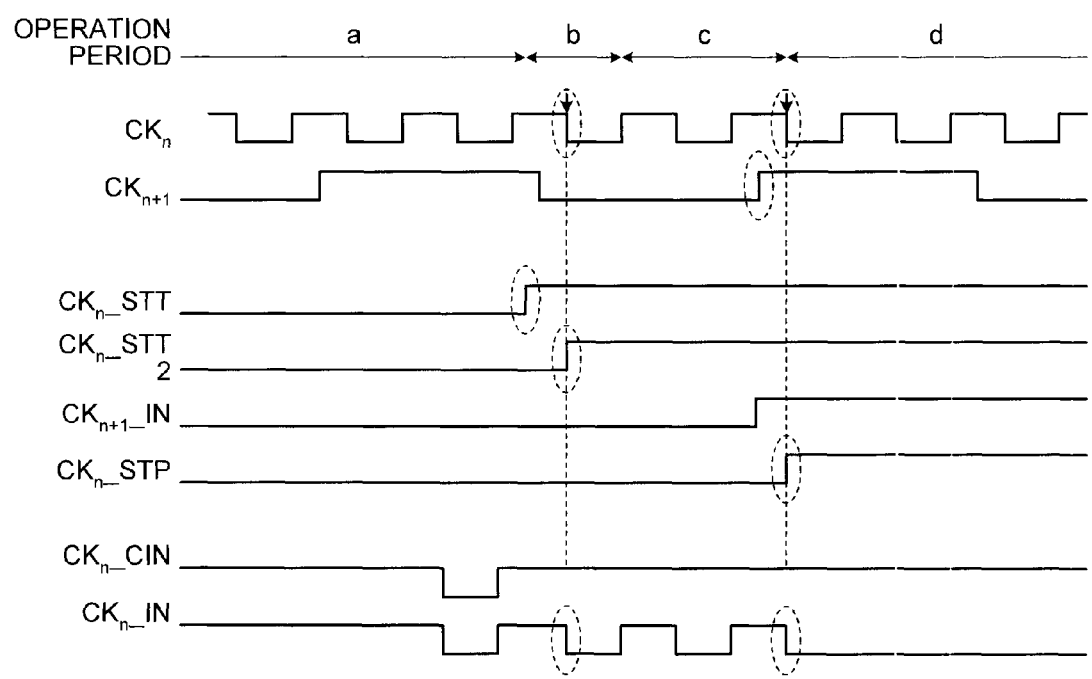
FIG. 3 is a timing chart illustrating a voltage waveform in each unit of a clock switching unit in FIG. 2.

FIG. 3 is a timing chart illustrating a voltage waveform in each unit of the clock switching unit in FIG. 2.

In an operation period a in FIG. 3, before the count start signal $CK_n\_STT$ rises, the output of the latch circuit $L1_n$ is the low level and therefore the carry signal $CK_n\_CIN$ is selected in the selector $MX_n$. Moreover, before the count start signal $CK_n\_STT$ rises, a count start signal $CK_n\_STT2$ and the count stop signal $CK_n\_STP$ are also the low level, so that the carry signal $CK_n\_CIN$ is output to the first stage of the flip-flop $FF_n$ via the AND circuit $ND_n$ and counting by the flip-flop $FF_n$ is performed.

Next, in an operation period b, when the count start signal $CK_n\_STT$ rises, the count start signal $CK_n\_STT2$ rises in synchronization with the clock $CK_n$ and the output of the latch circuit $L1_n$ becomes the high level, so that the clock $CK_n$ is selected in the selector $MX_n$.

In the operation periods b and c, before the Block $CK_{n+1}$ rises, even when the count start signal $CK_n\_STT2$ rises, the count stop signal $CK_n$ STP is maintained to the low level. Therefore, the clock $CK_n$ is output to the first stage of the flip-flop $FF_n$ via the AND circuit $ND_n$ and counting by the flip-flop $FF_n$ is performed.

Then, when the clock $CK_{n+1}$ rises in the operation period c, the count stop signal $CK_n\_STP$ rises in synchronization with the clock $CK_n$ in an operation period d and the count stop signal $CK_n\_STP$ of the local stage is input to the sub counter $CU_{n+1}$ as a count start signal $CK_{n+1}\_STT$ of the next stage. Moreover, when the count stop signal $CK_n\_STP$ rises, outputting of the clock $CK_n$ to the flip-flop $FF_n$ is blocked in the AND circuit $ND_n$ and the counting operation by the flip-flop $FF_n$ is stopped.

Even if counting is switched to the low-speed clock, the accuracy of the high-speed clock can be ensured in the measurement time by measuring the time to the edge of the low-speed clock by the high-speed clock. Therefore, even when the counting operation is finally performed by the slowest clock, the accuracy of the highest-speed crock can be ensured by sequentially propagating control at the edge of a clock from the high-speed sub counter to the low-speed sub counter.

Figure 4:
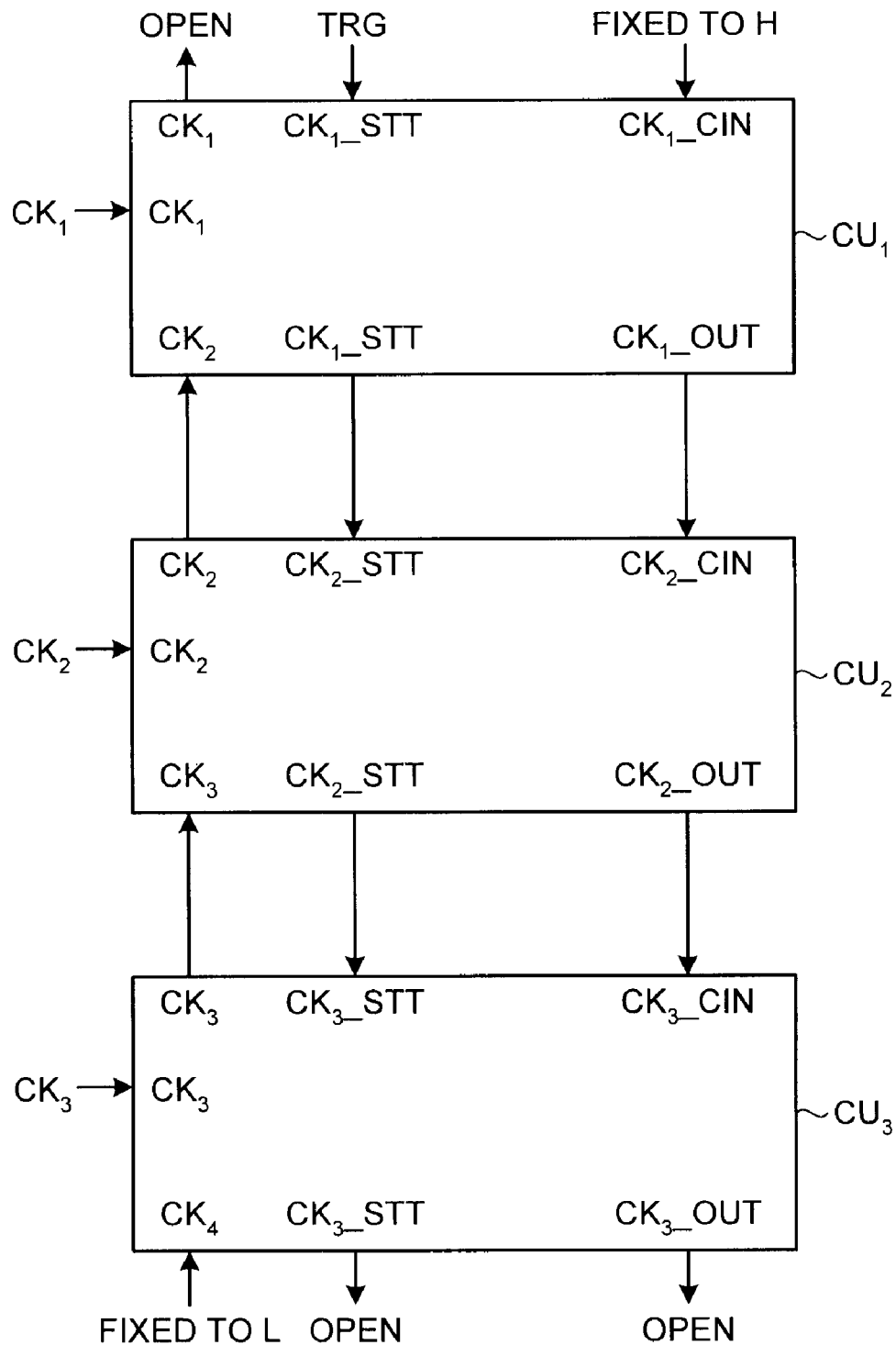
FIG. 4 is a block diagram illustrating a configuration of sub counters for three stages of the counter circuit according to the first embodiment.

FIG. 4 is a block diagram illustrating the schematic configuration of the sub counters for three stages of the counter circuit according to the first embodiment.

In FIG. 4, the sub counter $CU_1$ is provided in the first stage, the sub counter $CU_2$ is provided in the intermediate stage, and the sub counter $CU_3$ is provided in the last stage. The clock $CK_1$ is input to the sub counter $CU_1$, the clock $CK_2$ is input to the sub counter $CU_2$, and the clock $CK_3$ is input to the sub counter $CU_3$.

Moreover, a clock $CK_4$ input to the sub counter $CU_3$ is fixed to the low level, the clock $CK_3$ is input to the sub counter $CU_2$ from the sub counter $CU_3$, the clock $CK_2$ is input to the sub counter $CU_1$ from the sub counter $CU_2$, and the clock $CK_1$ output from the sub counter $CU_1$ is open.

Furthermore, a start signal TRG is input to the sub counter $CU_1$ as the count start signal $CK_n\_STT$, the count stop signal $CK_1\_STP$ is input from the sub counter $CU_1$ to the sub counter $CU_2$ as the count start signal $CK_2\_STT$, the count stop signal $CK_2\_STP$ is input from the sub counter $CU_2$ to the sub counter $CU_3$ as the count start signal $CK_3\_STT$, and the count stop signal $CK_3\_STP$ output from the sub counter $CU_3$ is open. As the start signal TRG, the output of the comparator PA in FIG. 1 can be used.

Moreover, the carry signal $CK_1\_CIN$ input to the sub counter $CU_1$ is fixed to the high level, the carry signal $CK_1\_OUT$ of the local stage is input from the sub counter $CU_1$ to the sub counter $CU_2$ as the carry signal $CK_2\_OUT$ of the next stage, the carry signal $CK_2\_OUT$ of the local stage is input from the sub counter $CU_2$ to the sub counter $CU_3$ as the carry signal $CK_3\_OUT$ of the next stage, and the carry signal $CK_3\_OUT$ of the local stage output from the sub counter $CU_3$ is open.

Consequently, the counting operation of the sub counter $CU_2$ can be started after finishing the counting operation of the sub counter $CU_1$ by propagating the count stop signal $CK_1\_STP$ from the sub counter $CU_1$ to the sub counter $CU_2$, and the counting operation of the sub counter $CU_3$ can be started after finishing the counting operation of the sub counter $CU_2$ by propagating the count stop signal $CK_2\_STP$ from the sub counter $CU_2$ to the sub counter $CU_3$.

Figure 5:
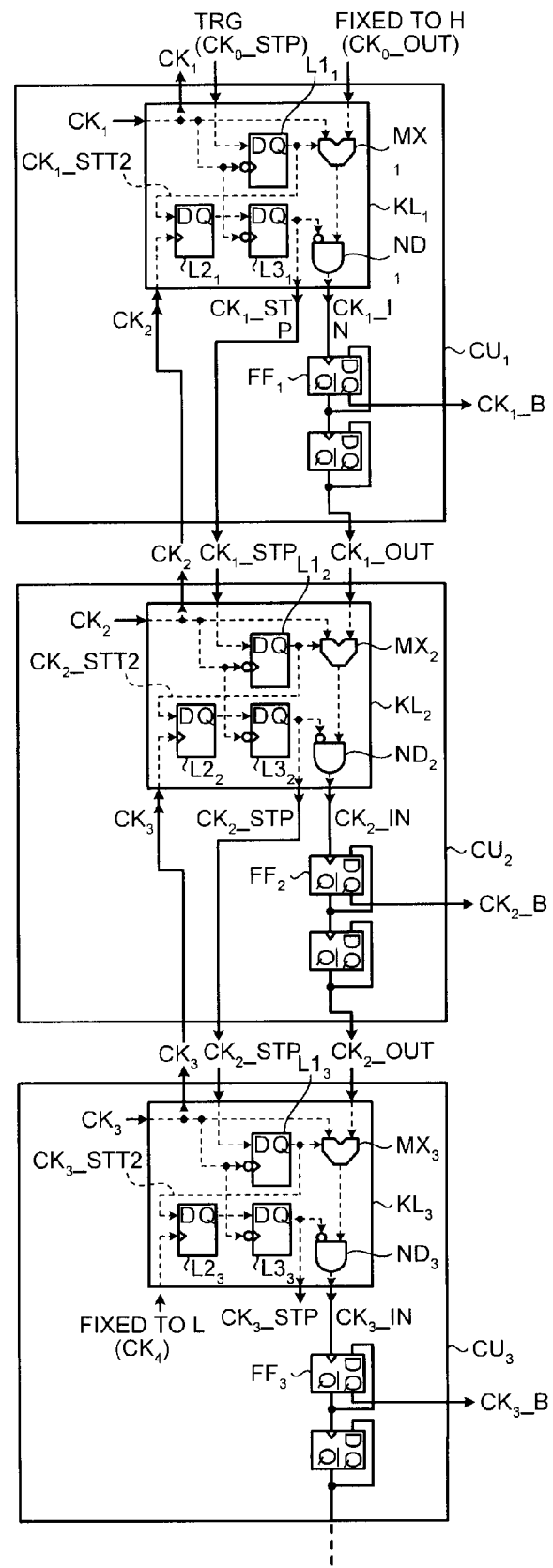
FIG. 5 is a block diagram illustrating the detailed configuration of the sub counters for three stages of the counter circuit in FIG. 4.

FIG. 5 is a block diagram illustrating the detailed configuration of the sub counters for three stages of the counter circuit in FIG. 4.

In FIG. 5, the sub counters $CU_1$ to $CU_3$ include the clock switching units $KL_1$ to $KL_3$ and the flip-flops $FF_1$ to $FF_3$, respectively.

The clock switching units $KL_1$ to $KL_3$ include the selectors $MX_1$ to $MX_3$, the AND circuits $ND_1$ to $ND_3$, and the latch circuits $L1_1$ to $L3_1$, $L1_2$ to $L3_2$, and $L1_3$ to $L3_3$, respectively.

Figure 6:
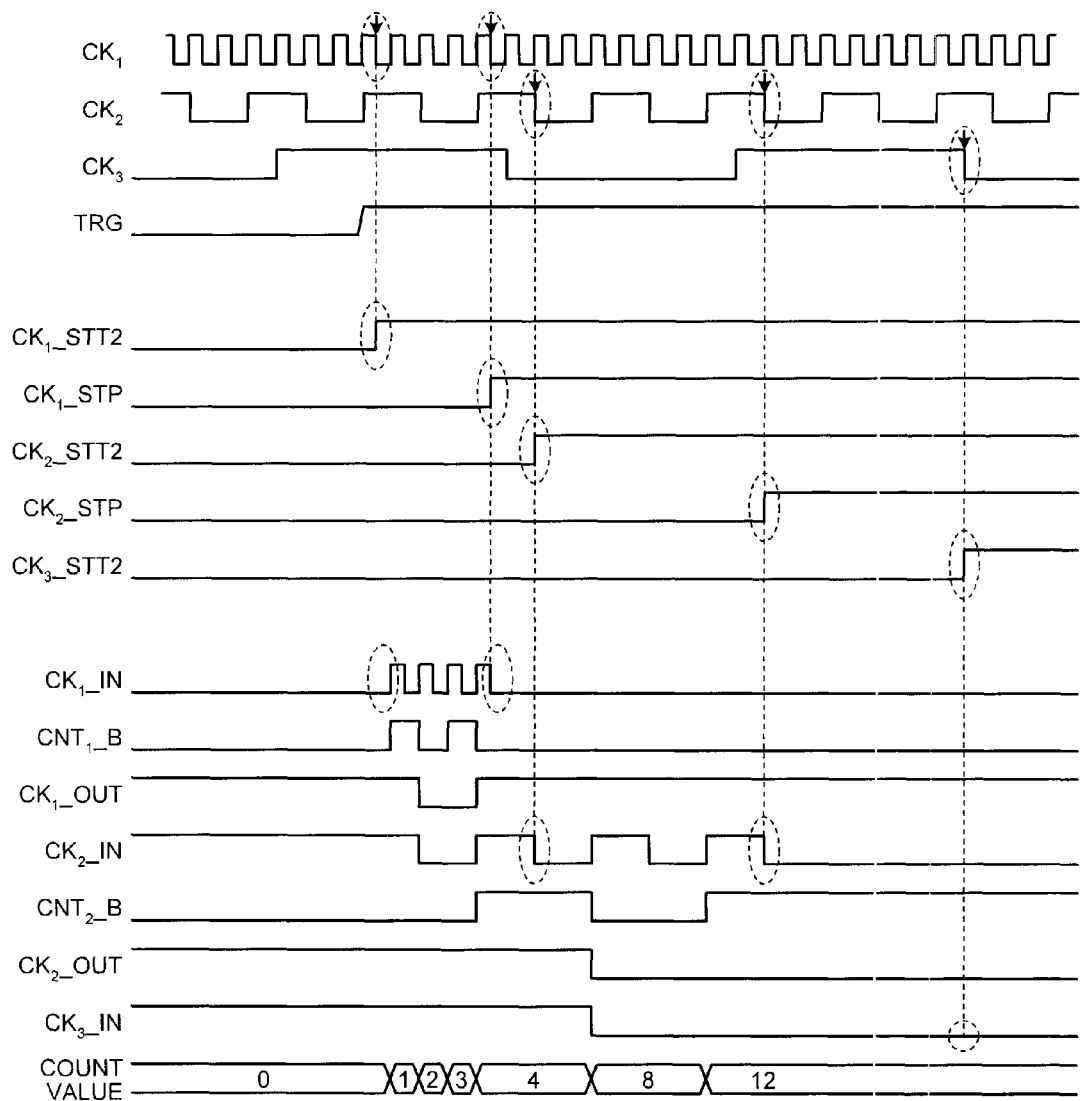
FIG. 6 is a timing chart illustrating a voltage waveform in each unit of the counter circuit in FIG. 5.

FIG. 6 is a timing chart illustrating a voltage waveform in each unit of the counter circuit in FIG. 5.

In FIG. 6, before the start signal TRG ($CK_0\_STP$) rises, the output of the latch circuit $L1_1$ is the low level and therefore the carry signal $CK_0\_OUT$ is selected in the selector $MX_1$. The carry signal $CK_0\_OUT$ is fixed to the high level.

Moreover, before the start signal TRG rises, the count start signal $CK_1\_STT2$ and the count stop signal $CK_1\_STP$ are also the low level, so that the carry signal $CK_1\_CIN$ is input to the first stage of the flip-flop $FF_1$ via the AND circuit $ND_1$ and counting by the flip-flop $FF_1$ is performed.

Next, when the start signal TRG rises, the count start signal $CK_1\_STT2$ rises in synchronization with the clock $CK_1$ and the output of the latch circuit $L1_1$ becomes the high level, so that the clock $CK_1$ is selected in the selector $MX_1$.

Before the clock $CK_2$ rises, even when the count start signal $CK_1\_STT2$ rises, the count stop signal $CK_1\_STP$ is maintained to the low level. Therefore, the clock $CK_1$ is output to the first stage of the flip-flop $FF_1$ via the AND circuit $ND_1$ and counting by the flip-flop $FF_1$ is performed.

Then, when the clock $CK_2$ rises, the count stop signal $CK_1\_STP$ rises in synchronization with the clock $CK_1$ and the count stop signal $CK_1\_STP$ is input to the sub counter $CU_2$. Moreover, when the count stop signal $CK_1\_STP$ rises, outputting of the clock $CK_1$ to the flip-flop $FF_1$ is blocked in the AND circuit $ND_1$ and the counting operation by the flip-flop $FF_1$ is stopped.

Moreover, before the count stop signal $CK_1\_STP$ rises, the count start signal $CK_2\_STT2$ and the count stop signal $CK_2\_STP$ are also the low level, so that the carry signal $CK_2\_CIN$ is input to the first stage of the flip-flop $FF_2$ via the AND circuit $ND_2$ and counting by the flip-flop $FF_2$ is performed.

Next, when the count stop signal $CK_1\_STP$ rises, the count start signal $CK_2\_STT2$ rises in synchronization with the clock $CK_2$ and the output of the latch circuit $L1_2$ becomes the high level, so that the clock $CK_2$ is selected in the selector $MX_2$.

Before the clock $CK_3$ rises, even when the count start signal $CK_2\_STT2$ rises, the count stop signal $CK_2\_STP$ is maintained to the low level. Therefore, the clock $CK_2$ is output to the first stage of the flip-flop $FF_2$ via the AND circuit $ND_2$ and counting by the flip-flop $FF_2$ is performed.

Then, when the clock $CK_3$ rises, the count stop signal $CK_2\_STP$ rises in synchronization with the clock $CK_2$ and the count stop signal $CK_2\_STP$ is input to the sub counter $CU_3$. Moreover, when the count stop signal $CK_2\_STP$ rises, outputting of the clock $CK_2$ to the flip-flop $FF_2$ is blocked in the AND circuit $ND_2$ and the counting operation by the flip-flop $FF_2$ is stopped.

When the number of stages of the sub counter $CU_1$ that performs counting by the clock $CK_1$ is N1 and the number of stages of the sub counter $CU_2$ that performs counting by the clock $CK_2$ is N2, the frequency of the clock $CK_2$ and the frequency of the clock $CK_3$ are $1/2^{N1}$ and $1/2^{N1+N2}$ with respect to the frequency of the clock $CK_1$.

Consequently, it is possible to restrict the period in which current of the clock $CK_1$ flows to the time on the order of the frequency of the clock $CK_2$ while maintaining the clock $CK_3$ that determines the average current consumption to a sufficiently low frequency. Therefore, it becomes possible to suppress the average current consumption while shortening the time during which the current of the clock $CK_1$ flows.

Figure 7:
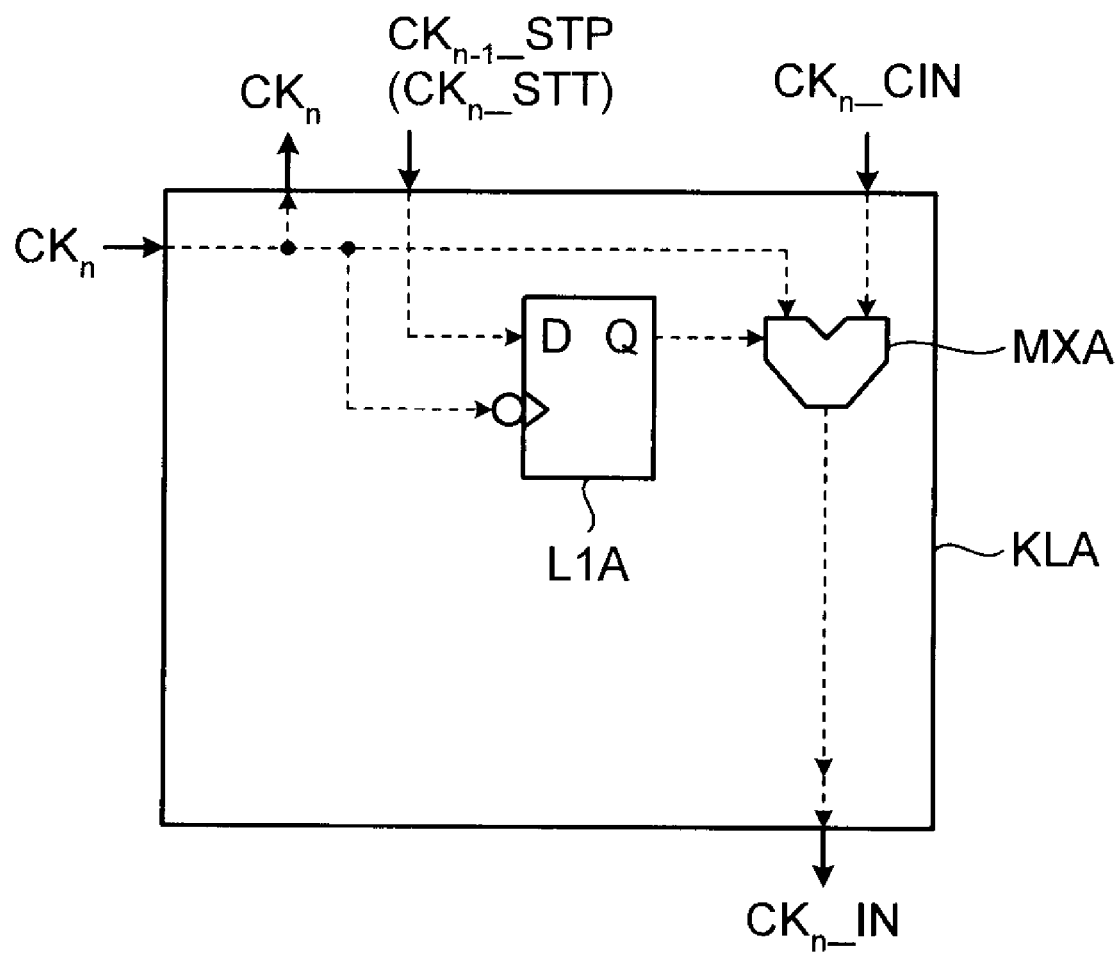
FIG. 7 is a block diagram illustrating a configuration of a last stage of the clock switching unit in FIG. 2.

FIG. 7 is a block diagram illustrating the configuration of the last stage of the clock switching unit in FIG. 2.

In FIG. 7, a clock switching unit KLA of the sub counter of the last stage includes a selector MXA and a latch circuit L1A. The clock $CK_n$ is input to one input terminal of the selector MXA, the carry signal $CK_n\_CIN$ is input to the other input terminal of the selector MXA, and the output of the latch circuit L1A is input to the switching terminal of the selector MXA. The output $CK_n\_IN$ of the selector MXA is input to the first stage of the flip-flop $FF_n$.

The count stop signal $CK_{n-1}\_STP$ of the previous stage is input to the input terminal of the latch circuit L1A as the count start signal $CK_n\_STT$ of the local stage and the inverted signal of the clock $\overline{CK_n}$ is input to the clock terminal of the latch circuit L1A.

In this clock switching unit KLA, the count stop signal $CK_n\_STP$ does not need to be output as the count start signal $CK_{n+1}\_STT$ of the next stage, so that the circuits related to the count stop signal $CK_n\_STP$ can be omitted. Specifically, in the clock switching unit KLA of the last stage, the AND circuit ND$_n$ and the latch circuits L2$_n$ and L3$_n$ can be omitted compared with the clock switching unit KL$_n$ of the intermediate stage in FIG. 2, enabling to reduce the circuit scale.

(Second Embodiment)

Figure 8:
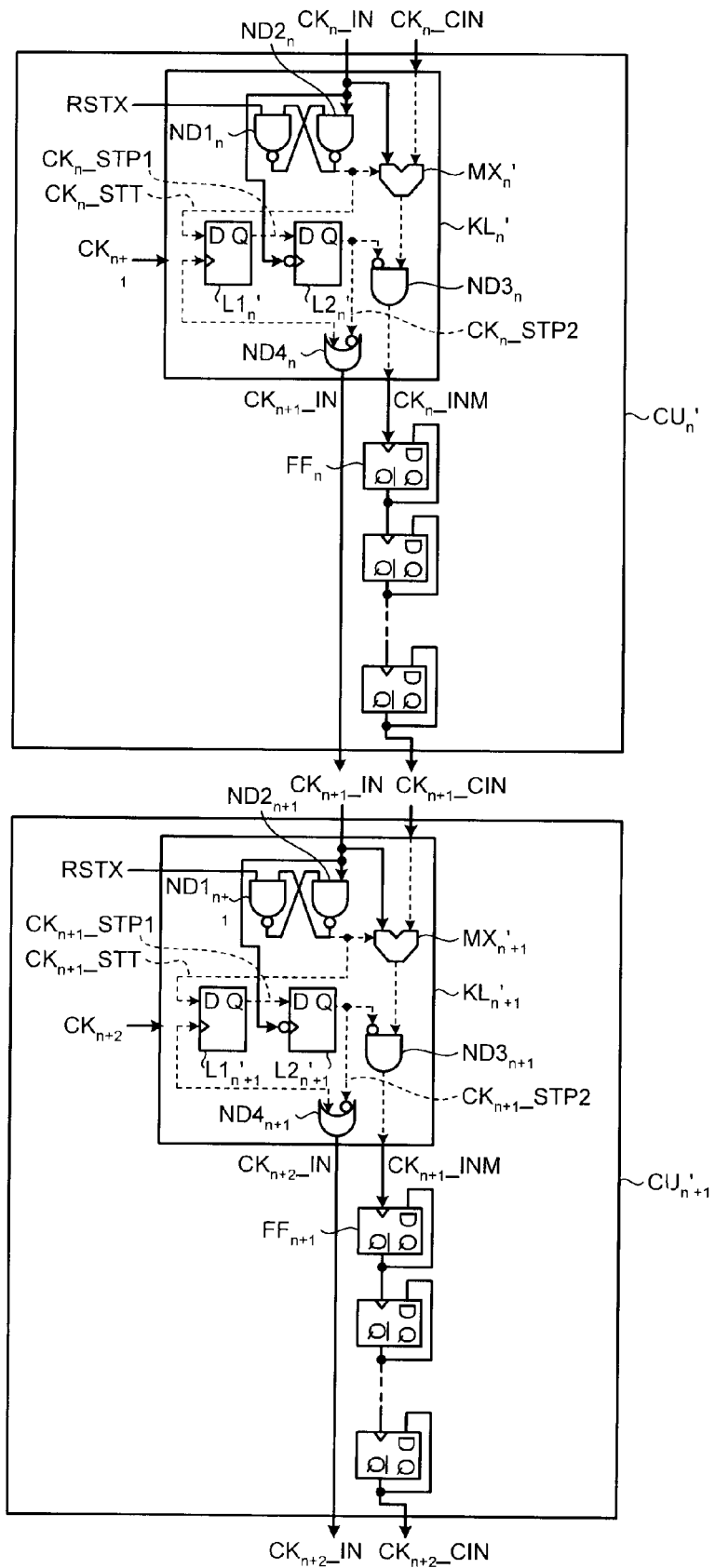
FIG. 8 is a block diagram illustrating a configuration of sub counters for two stages in the intermediate stage of a counter circuit according to a second embodiment.

FIG. 8 is a block diagram illustrating the configuration of the sub counters for two stages in the intermediate stage of the counter circuit according to the second embodiment.

In FIG. 8, this counter circuit includes sub counters CU$_n$' and CU$_{n+1}$' instead of the sub counters CU$_n$ and CU$_{n+1}$ in FIG. 2. The sub counters CU$_n$' and CU$_{n+1}$' include clock switching units KL$_1$' and KL$_{n+1}$' instead of the clock switching units KL$_n$ and KL$_{n+1}$ in FIG. 2, respectively.

While the clocks CK$_n$ and CK$_{n+1}$ are input from the outside of the counter circuits in the clock switching units KL$_n$ and KL$_{n+1}$, the clocks CK$_{n+1}$ and CK$_{n+2}$ are input from the outside of the counter circuit in the clock switching units KL$_1$' and KL$_{n+1}$'. Moreover, in the clock switching units KL$_1$' and KL$_{n+1}$', the clocks CK$_n$ and CK$_{n+1}$ are input from the sub counters CU$_{n-1}$ and CU$_n$ of the previous stage, respectively.

Moreover, while a dedicated signal line that transmits the count stop signal CK$_n$_STP to the sub counter CU$_{n+1}$ of the next stage is provided in the clock switching unit KL$_n$, a signal line that transmits the count stop signal CK$_n$_STP2 to the sub counter CU$_{n+1}$' of the next stage and a signal line that transmits the clock CK$_{n+1}$ to the sub counter CU$_{n+1}$' of the next stage are shared in the clock switching unit KL$_n$'.

The clock switching units KL$_n$' and KL$_{n+1}$' include selectors MX$_n$' and MX$_{n+1}$', NAND circuits ND1$_n$ and ND2$_n$, and ND1$_{n+1}$ and ND2$_{n+1}$, AND circuits ND3$_n$ and ND3$_{n+1}$, OR circuits ND4$_n$ and ND4$_{n+1}$, and latch circuits L1$_n$' and L2$_n$', and L1$_{n+1}$' and L2$_{n+1}$', respectively.

The clock CK$_n$_IN is input to one input terminal of the selector MX$_n$', the carry signal CK$_n$_CIN is input to the other input terminal of the selector MX$_n$', and the output of the NAND circuit ND2$_n$ is input to the switching terminal of the selector MX$_n$'. The clock CK$_n$_IN is a signal in which the inverted signal of the count stop signal CK$_n$_STP2 and the clock CK$_{n+1}$ are superimposed.

A reset signal RSTX is input to one input terminal of the NAND circuit ND1$_n$ and the output of the NAND circuit ND2$_n$ is input to the other input terminal of the NAND circuit ND1$_n$. The clock CK$_n$_IN is input to one input terminal of the NAND circuit ND2$_n$ and the output of the NAND circuit ND1$_n$ is input to the other input terminal of the NAND circuit ND2$_n$.

The output of the NAND circuit ND2$_n$ is input the input terminal of the latch circuit L1$_n$' as the count start signal CK$_n$_STT of the local stage and the clock CK$_n$ is input to the clock terminal of the latch circuit L1$_n$'. The output of the latch circuit L1$_n$' is input to the input terminal of the latch circuit L2$_n$' and the inverted signal of the clock CK$_n$_IN is input to the clock terminal of the latch circuit L2$_n$'.

The inverted signal of the output of the latch circuit L2$_n$' is input to one input terminal of the AND circuit ND3$_n$ and the output of the selector MX$_n$' is input to the other input terminal of the AND circuit ND3$_n$. An output CK$_n$_INM of the AND circuit ND3$_n$ is input to the first stage of the flip-flop FF$_n$.

The clock CK$_{n+1}$ is input to one input terminal of the OR circuit ND4$_n$ and the inverted signal of the count stop signal CK$_n$_STP2 is input to the other input terminal of the OR circuit ND4$_n$. The output of the OR circuit ND4$_n$ is output to the sub counter CU$_{n+1}$' as a clock CK$_{n+1}$_IN.

Figure 9:
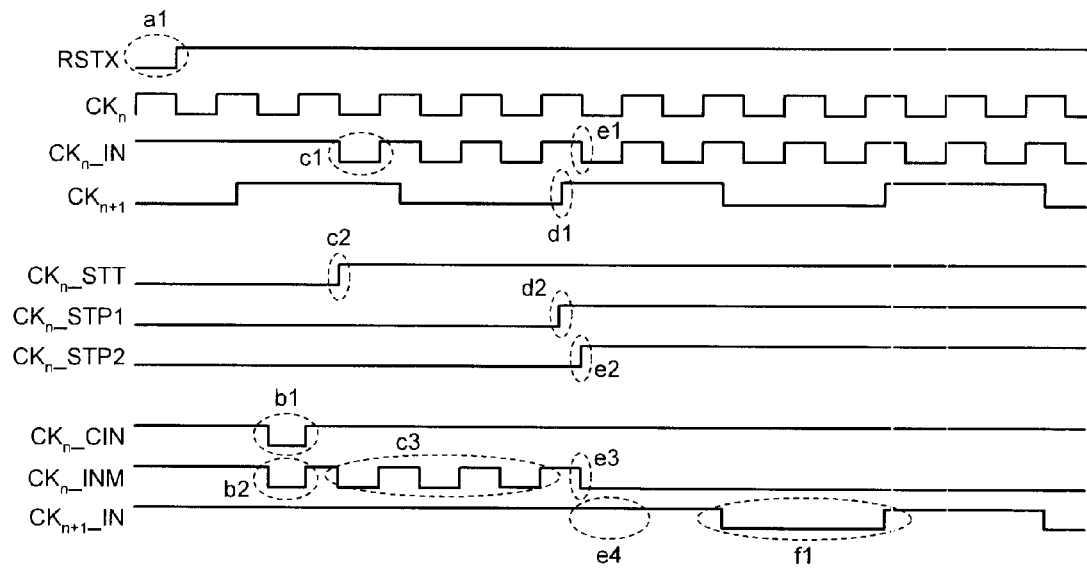
FIG. 9 is a timing chart illustrating a voltage waveform in each unit of the clock switching circuit in FIG. 8.

FIG. 9 is a timing chart illustrating a voltage waveform in each unit of the clock switching circuit in FIG. 8.

In FIG. 9, before starting counting, the reset signal RSTX is set to the low level (a1), so that the output of the NAND circuit ND2$_n$ becomes the low level and the count start signal CK$_n$_STT is set to the low level.

On the other hand, before the count start signal CK$_n$_STT rises, the clock CK$_n$_IN is maintained to the high level upon reception of the count stop signal CK$_{n-1}$_STP2 from the sub counter CU$_{n-1}$ of the previous stage. Therefore, even when the reset signal RSTX rises, the count start signal CK$_n$_STT is maintained to the low level and the carry signal CK$_n$_CIN is selected in the selector MX$_n$'. Moreover, before the count start signal CK$_n$_STT rises, the count stop signals CK$_n$_STP1 and CK$_n$_STP2 are also the low level, so that the carry signal CK$_n$_CIN is input to the first stage of the flip-flop FF$_n$ via the AND circuit ND3$_n$ (b1) and counting by the flip-flop FF$_n$ is performed (b2).

Next, when the clock CK$_n$_IN falls upon reception of the clock CK$_n$ from the sub counter CU$_{n-1}$ of the previous stage (c1), the count start signal CK$_n$_STT rises (c2) and the clock CK$_n$_IN is selected in the selector MX$_n$'.

Before the clock CK$_{n+1}$ rises, even when the count start signal CK$_n$_STT rises, the count stop signals CK$_n$_STP1 and CK$_n$_STP2 are maintained to the low level. Therefore, the clock CK$_n$ is output to the first stage of the flip-flop FF$_n$ via the AND circuit ND3$_n$ and counting by the flip-flop FF$_n$ is performed (c3).

Then, when the clock CK$_{n+1}$ rises (d1), the count stop signal CK$_n$_STP1 rises (d2) and further the count stop signal CK$_n$_STP2 rises in synchronization with the clock CK$_n$_IN (e1 and e2). Therefore, the count stop signal CK$_n$_STP2 of the local stage is superimposed on the clock CK$_{n+1}$ via the OR circuit ND4$_n$ and is input to the sub counter CU$_{n+1}$ as the clock CK$_{n+1}$_IN (e4 and f1). Moreover, when the count stop signal CK$_n$_STP2 rises, outputting of the clock CK$_n$ to the flip-flop FF$_n$ is blocked in the AND circuit ND3$_n$ and the counting operation by the flip-flop FF$_n$ is stopped (e3).

Consequently, the signal line that transmits the count stop signal CK$_n$_STP2 to the sub counter CU$_{n+1}$' of the next stage and the signal line that transmits the clock CK$_{n+1}$ to the sub counter CU$_{n+1}$' of the next stage can be shared, so that one signal line between the sub counters CU$_n$' and CU$_{n+1}$' can be reduced, enabling to reduce the layout area.

In the counter circuit in FIG. 8, a starting circuit that generates the clock CK$_1$_IN to be input to the sub counter CU$_1$ of the first stage is needed for receiving the clock CK$_n$_IN from the sub counter CU$_{n-1}$ of the previous stage.

Figure 10:
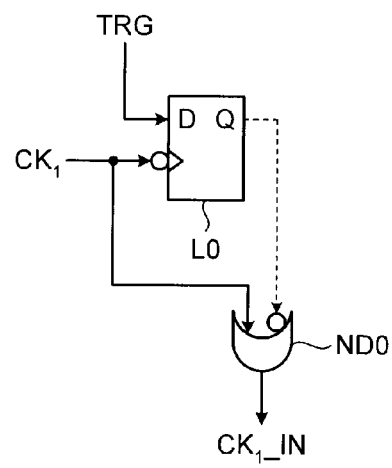
FIG. 10 is a block diagram illustrating a configuration of a starting circuit applied to the counter circuit in FIG. 8.

FIG. 10 is a block diagram illustrating the configuration of the starting circuit applied to the counter circuit in FIG. 8.

In FIG. 10, the starting circuit includes a latch circuit L0 and an OR circuit ND0. The start signal TRG is input to the input terminal of the latch circuit L0 and the inverted signal of the clock CK$_1$ is input to the clock terminal of the latch circuit L0. The clock CK$_1$ is input to one input terminal of the OR circuit ND0 and the inverted signal of the output of the latch circuit L0 is input to the other input terminal of the OR circuit ND0.

Figure 11:
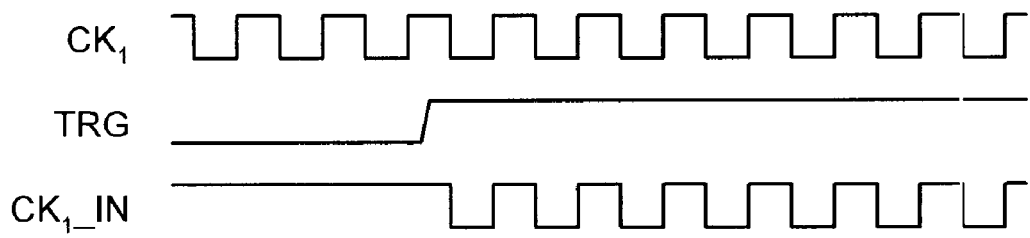
FIG. 11 is a timing chart illustrating a voltage waveform in each unit of the starting circuit in FIG. 10.

FIG. 11 is a timing chart illustrating a voltage waveform in each unit of the starting circuit in FIG. 10.

In FIG. 11, before the start signal TRG rises, the output of the latch circuit L0 is the low level. Therefore, the output of the OR circuit ND0 becomes the high level and the clock CK$_1$_IN becomes the high level.

Then, when the start signal TRG rises, the output of the latch circuit L0 becomes the high level and the clock CK$_1$ is output as the clock CK$_1$_IN via the OR circuit ND0.

Figure 12:
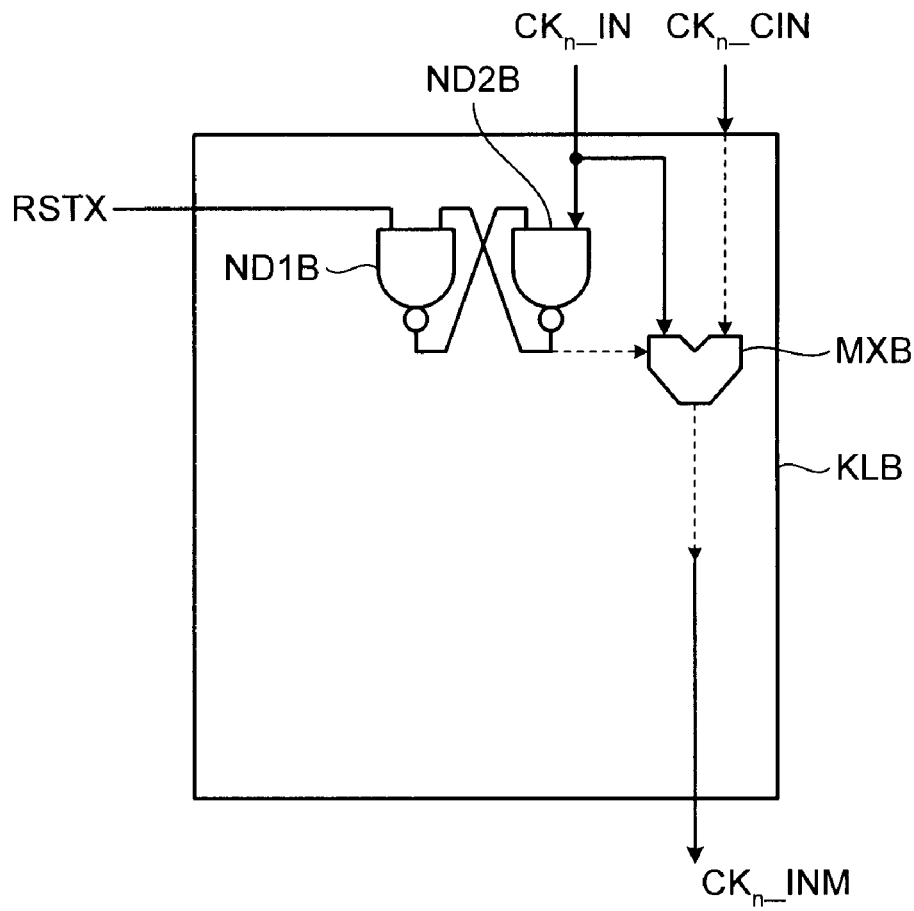
FIG. 12 is a block diagram illustrating a configuration of a last stage of the counter circuit in FIG. 8.

FIG. 12 is a block diagram illustrating the configuration of the last stage of the counter circuit in FIG. 8.

In FIG. 12, a clock switching unit KLB of the sub counter of the last stage includes a selector MXB and NAND circuits ND1B and ND2B. The clock $CK_{n}\_IN$ is input to one input terminal of the selector MXB, the carry signal $CK_{n}\_CIN$ is input to the other input terminal of the selector MXB, and the output of the NAND circuit ND2B is input to the switching terminal of the selector MXB.

The reset signal RSTX is input to one input terminal of the NAND circuit ND1B and the output of the NAND circuit ND2B is input to the other input terminal of the NAND circuit ND2B. The clock $CK_{n}\_IN$ is input to one input terminal of the NAND circuit ND2B and the output of the NAND circuit ND1B is input to the other input terminal of the NAND circuit ND2B.

In this clock switching unit KLB, the clock $CK_{n+1}\_IN$ does not need to be output to the next stage, so that the circuits related to the clock $CK_{n+1}\_IN$ can be omitted. Specifically, in the clock switching unit KLB of the last stage, the AND circuit $ND3_n$, the OR circuit $ND4_n$, and the latch circuits $L1_n'$ and $L2_n'$ can be omitted compared with the clock switching unit $KL_n'$ of the intermediate stage in FIG. 8, enabling to reduce the circuit scale.

Figure 13:
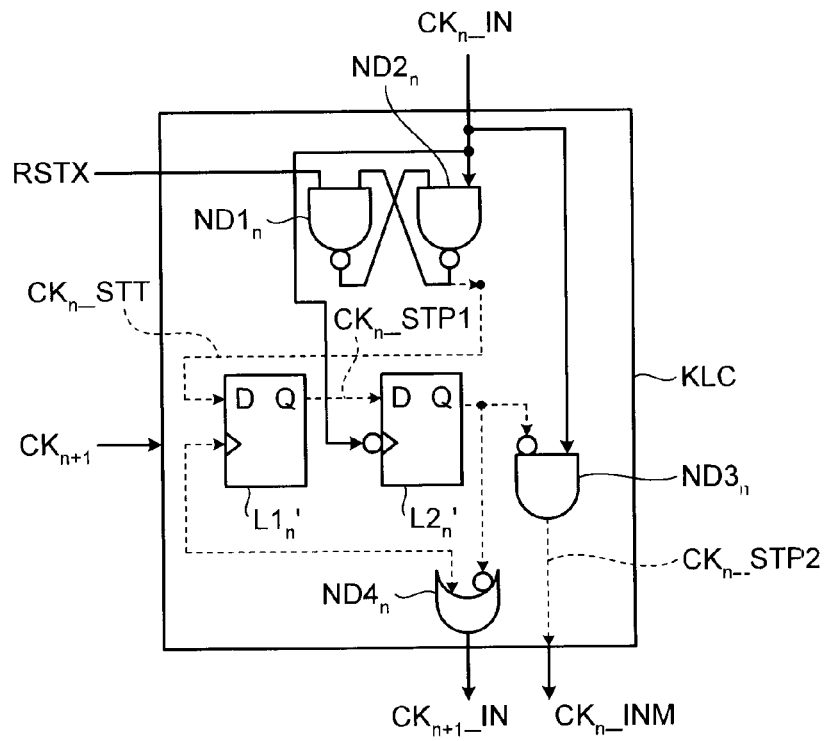
FIG. 13 is a block diagram illustrating a configuration of a first stage of the counter circuit in FIG. 8.

FIG. 13 is a block diagram illustrating the configuration of the first stage of the counter circuit in FIG. 8.

In FIG. 13, in a clock switching unit KLC of the sub counter of the first stage, the selector $MX_n'$ is removed from the clock switching unit $KL_n'$ in FIG. 8. In the clock switching unit KLC, the input of the carry signal $CK_n\_CIN$ is omitted and the clock $CK_n\_IN$ is directly input to the AND circuit $ND3_n$.

In this clock switching unit KLC, the carry signal $CK_n\_CIN$ does not need to be input, so that the circuits related to the carry signal $CK_n\_CIN$ can be omitted. Specifically, in the clock switching unit KLC of the first stage, the selector $MX_n'$ can be omitted compared with the clock switching unit $KL_n'$ of the intermediate stage in FIG. 8, enabling to reduce the circuit scale.

(Third Embodiment)

Figure 14:
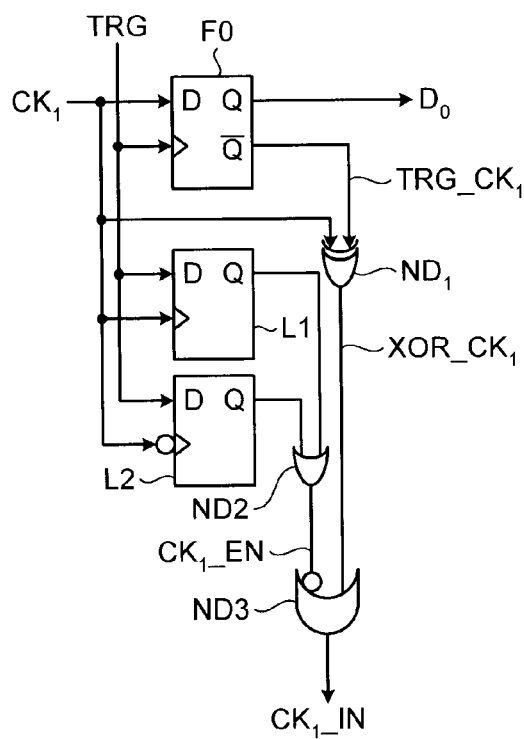
FIG. 14 is a block diagram illustrating a configuration of a starting circuit applied to a counter circuit according to a third embodiment.

FIG. 14 is a block diagram illustrating a configuration of a starting circuit applied to a counter circuit according to the third embodiment.

While the start signal TRG is detected at the edge on one side of the clock $CK_1$ in the starting circuit in FIG. 10, the start signal TRG is detected at the edge on both sides of the clock $CK_1$ in the starting circuit in FIG. 14.

This starting circuit includes a flip-flop F0, latch circuits L1 and L2, an XOR circuit ND1, and OR circuits ND2 and ND3. The start signal TRG is input to the clock terminal of the flip-flop F0 and the input terminals of the latch circuits L1 and L2, the clock $CK_1$ is input to the input terminal of the flip-flop F0, the clock terminal of the latch circuit L1, and one input terminal of the XOR circuit ND1, and the inverted signal of the clock $CK_1$ is input to the clock terminal of the latch circuit L2.

The inverted output of the flip-flop F0 is input to the other input terminal of the XOR circuit ND1, the output of the latch circuit L2 is input to one input terminal of the OR circuit ND2, the output of the latch circuit L1 is input to the other input terminal of the OR circuit ND2, the output of the OR circuit ND2 is input to one input terminal of the OR circuit ND3, and the inverted signal of the output of the XOR circuit ND1 is input to the other input terminal of the OR circuit ND3.

The start signal TRG is detected at the edge on both sides of the clock $CK_1$, so that counting using the edge on both sides of the clock $CK_1$ can be performed in the least significant bit. Therefore, counting can be performed at substantially a double frequency, enabling to reduce the current consumption by the counting by the high-speed clock.

Figure 15:
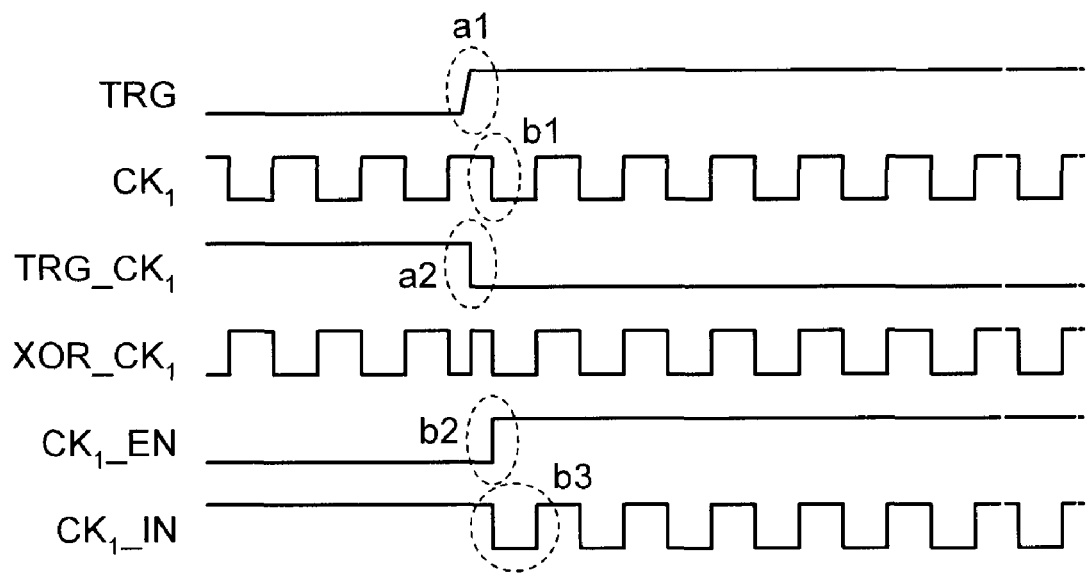
FIG. 15 is a timing chart illustrating a voltage waveform in each unit when starting the starting circuit in FIG. 14 at a rising edge.

FIG. 15 is a timing chart illustrating a voltage waveform in each unit when starting the starting circuit in FIG. 14 at a rising edge.

In FIG. 15, before the start signal TRG rises, the outputs of the latch circuits L1 and L2 are the low level. Therefore, an output $CK_1\_EN$ of the OR circuit ND2 becomes the low level and the clock $CK_1\_IN$ becomes the high level.

Then, when the start signal TRG rises (a1), an inverted output $TRG\_CK_1$ of the flip-flop F0 falls by capturing the value of the clock $CK_1$ (a2) and the clock $CK_1$ is obtained as an output $XOR\_CK_1$ of the OR circuit ND2.

Moreover, when the start signal TRG rises (a1), the output of the latch circuit L2 becomes the high level in synchronization with the falling of the clock $CK_1$ (b1). Therefore, the output $CK_1\_EN$ of the OR circuit ND2 becomes the high level (b2) and the output $XOR\_CK_1$ of the XOR circuit ND1 is output as the clock $CK_1\_IN$ via the OR circuit ND3 (b3).

Figure 16:
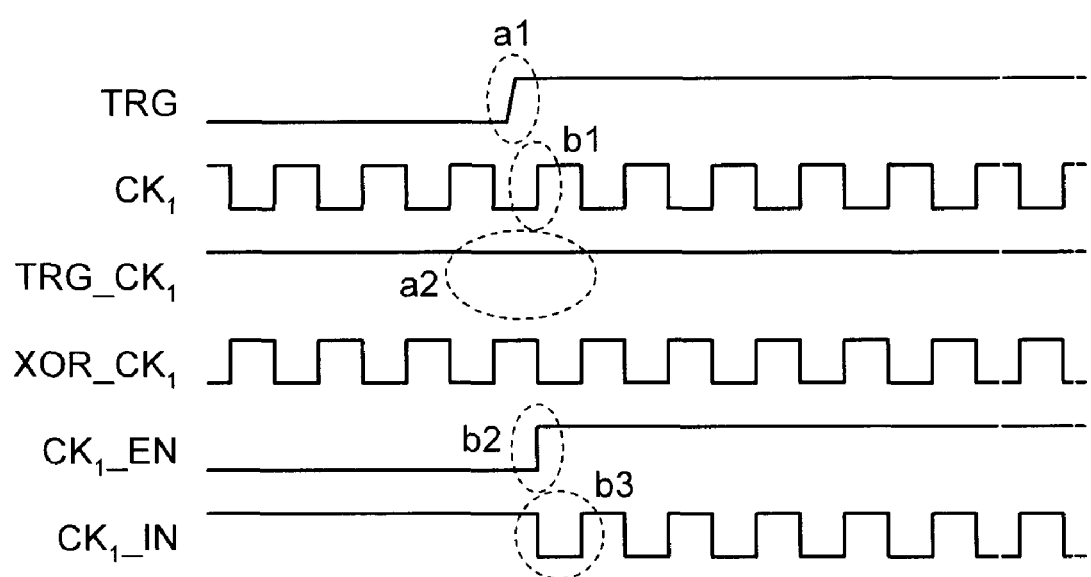
FIG. 16 is a timing chart illustrating a voltage waveform in each unit when starting the starting circuit in FIG. 14 at a falling edge.

FIG. 16 is a timing chart illustrating a voltage waveform in each unit when starting the starting circuit in FIG. 14 at a falling edge.

In FIG. 16, before the start signal TRG rises, the outputs of the latch circuits L1 and L2 are the low level. Therefore, the output $CK_1\_EN$ of the OR circuit ND2 becomes the low level and the clock $CK_1\_IN$ becomes the high level.

Then, when the start signal TRG rises (a1), the inverted output $TRG\_CK_1$ of the flip-flop F0 captures the value of the clock $CK_1$. However, the inverted output $TRG\_CK_1$ is the same state as the initial state and thus does not change (a2), and the inverted signal of the clock $CK_1$ is obtained as output $XOR\_CK_1$ of the OR circuit ND2.

Moreover, when the start signal TRG rises (a1), the output of the latch circuit L1 becomes the high level in synchronization with the rising of the clock $CK_1$ (b1). Therefore, the output $CK_1\_EN$ of the OR circuit ND2 becomes the high level (b2) and the output $XOR\_CK_1$ of the XOR circuit ND1 is output as the clock $CK_1\_IN$ via the OR circuit ND3 (b3).

The case of capturing the rising of the clock $CK_1$ is compared with the case of capturing the falling of the clock $CK_1$. In both cases, the clock $CK_1\_IN$ falls at the first edge after the start signal TRG is inverted and counting is started.

Moreover, because an output $D_0$ of the flip-flop F0 holds information indicating a start point of counting, the count value for a half clock can be obtained by reading this value.

(Fourth Embodiment)

Figure 17:
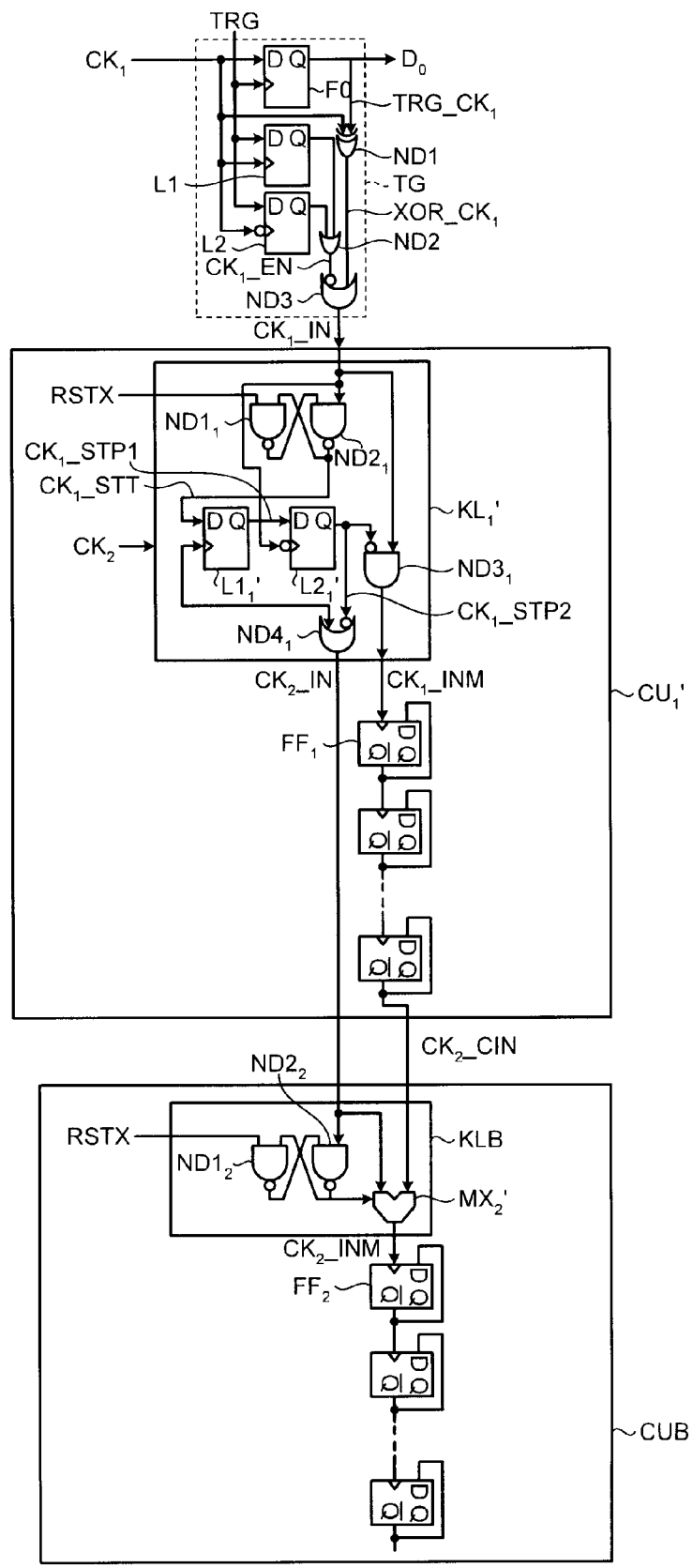
FIG. 17 is a block diagram illustrating a schematic configuration of sub counters for two stages of a counter circuit according to a fourth embodiment.

FIG. 17 is a block diagram illustrating the schematic configuration of the sub counters for two stages of a counter circuit according to the fourth embodiment. In this configuration, addition of circuits with respect to the configuration in which counting is performed by one clock is reduced.

In FIG. 17, this counter circuit includes the sub counter $CU_1'$ on the first stage and a sub counter CUB on the second stage. The sub counter $CU_1'$ includes the clock switching unit KLC in FIG. 13 as the clock switching unit $KL_1'$. Moreover, the sub counter CUB includes the clock switching unit KLB in FIG. 12 as the clock switching unit. Furthermore, a starting circuit TG in FIG. 14 is provided on the previous stage of the sub counter $CU_1'$.

Consequently, even when the counter circuit that operates by two clocks $CK_1$ and $CK_2$ of different frequencies is configured, increase in circuit scale can be suppressed compared with a counter circuit that operates only by one clock $CK_1$.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A counter circuit comprising:
    S (S is an integer equal to or larger than two) number of sub counters each of which counts S number of clocks of different frequencies; and
    clock switching units each of which is provided for a corresponding one of the sub counters and starts a counting operation of a sub counter of a next stage after finishing a counting operation in a sub counter of a local stage.

2. The counter circuit according to claim 1, wherein each of the clock switching units transmits a carry signal to a sub counter of a next stage before starting a counting operation of the sub counter of the next stage.

3. The counter circuit according to claim 1, wherein only one of the S number of the sub counters sequentially performs a counting operation and remaining (S−1) number of sub counters stop a counting operation by sequentially starting a counting operation of a sub counter of a next stage after finishing a counting operation in a sub counter of a local stage.

4. The counter circuit according to claim 1, wherein each of the clock switching units includes a synchronization circuit that synchronizes timing of starting a counting operation of a sub counter of a next stage with a clock counted in a sub counter of a next stage by receiving the clock counted in the sub counter of the next stage by a local stage.

5. The counter circuit according to claim 1, wherein each of the clock switching units transmits a clock counted in a sub counter of a next stage to the sub counter of the next stage via a sub counter of a local stage.

6. The counter circuit according to claim 5, further comprising a logic circuit that superimposes a signal that starts a counting operation of a sub counter of a next stage on a signal line that transmits the clock counted in the sub counter of the next stage to the sub counter of the next stage via a sub counter of a local stage.

7. The counter circuit according to claim 1, wherein a sub counter of an n-th stage (n is an integer satisfying $1 \leq n \leq S$) includes a flip-flop for $\log_2 [f(CK_n)/f(CK_{n+1})]$ number of stages, where $f(CK_n)$ is a frequency of a clock counted in the sub counter of the n-th stage and $f(CK_{n+1})$ is a frequency of a clock counted in a sub counter of an (n+1)-th stage.

8. The counter circuit according to claim 1, wherein a frequency of a clock in a sub counter of a local stage is shorter than a frequency of a clock in a sub counter of a next stage.

9. The counter circuit according to claim 1, wherein a count stop signal of a sub counter of a previous stage is input to each of the clock switching units as a count start signal of a sub counter of a local stage.

10. The counter circuit according to claim 9, wherein a signal line that transmits a count stop signal of a sub counter of a local stage to a sub counter of a next stage and a signal line that transmits a clock counted in the sub counter of the next stage to the sub counter of the next stage are shared.

11. The counter circuit according to claim 10, further comprising a starting circuit that generates a clock to be input to a sub counter of a first stage.

12. The counter circuit according to claim 11, wherein the starting circuit detects a start signal at an edge on both sides of the clock to be input to the sub counter of the first stage.

13. The counter circuit according to claim 1, wherein
    each of the clock switching units includes
        a first latch circuit that latches a count stop signal of a sub counter of a previous stage based on a clock of a sub counter of a local stage,
        a second latch circuit that latches an output of the first latch circuit based on a clock of a sub counter of a next stage,
        a third latch circuit that latches an output of the second latch circuit based on the clock of the sub counter of the local stage,
        a selector that switches between the clock of the sub counter of the local stage and a carry signal based on the output of the first latch circuit, and
        an AND circuit that performs an AND operation based on an output of the third latch circuit and a selector output.

14. The counter circuit according to claim 13, wherein the second latch circuit, the third latch circuit, and the AND circuit are omitted in a clock switching unit of a sub counter of a last stage.

* * * * *